June 11, 1968 C. M. WRIGHT 3,388,265

COUPLING CIRCUIT

Filed Jan. 8, 1965

INVENTOR
CARL M. WRIGHT
BY John V. Regan
ATTORNEY

United States Patent Office 3,388,265
Patented June 11, 1968

3,388,265
COUPLING CIRCUIT

Carl M. Wright, Falls Church, Va., assignor to Radio Corporation of America, a corporation of Delaware
Filed Jan. 8, 1965, Ser. No. 424,265
1 Claim. (Cl. 307—112)

ABSTRACT OF THE DISCLOSURE

A circuit arrangement is described for connecting a plurality of switches to electronic logic circuitry in a manner that isolates the logic circuitry from the noise inherent in mechanical switches. A flip-flop and a number of single-pole, double-throw switches are connected so that the switches present an AND function to one input of the flip-flop and an OR function to the other. This circuit obviates the necessity of providing a flip-flop for each switch when more than one switch is required.

This invention relates to data processing systems, and more particularly to data processing systems of the type wherein mechanical and electromechanical components are incorporated into a single system.

In electronic data processing systems it is not uncommon to employ mechanical or electromechanical switches in combination with electrical circuits. When a mechanical or electromechanical switch is closed, the output consists of more or less random noise pulses for a period of time before becoming a true step function. These noise pulses are caused by the bouncing of the transfer contact. When such switches are used to drive electronic circuits, especially digital logic circuits, the noise can cause undesirable output pulses.

A prior art solution to this noise problem is to use a bypass capacitor. A difficulty with this solution is that large capacitors cause large undesirable time delays. If the capacitor is made small, the input impedance of the electronic load device tends to short the capacitor resulting in a discharge of the capacitor as the transfer contact bounces.

A more satisfactory solution to the contact bounce problem is to connect a flip-flop to the output terminals of the switch in order to isolate the contact noise from the electronic load. When the switch is activated, a step function along with random noise due to contact bounce is applied to the input of the flip-flop. As soon as the step function provides sufficient energy to exceed the threshold of the flip-flop, its output changes and remains steady no matter how much the transfer contact bounces. Consequently, the flip-flop is a coupling circuit which serves to isolate the electronic load from contact noise.

Previous to this invention, the practice was to use one flip-flop for each switch being coupled to an electronic load. This practice is economically undesirable since a large number of flip-flops may be required.

It is a general object of this invention to prevent undesirable contact bounce noise pulses from affecting electronic circuits.

It is another object of this invention to provide an improved circuit arrangemnet having relatively rapid circuit response to input information by coupling mechanical or electromechanical switches to electronic circuits with flip-flops.

A more specific object of the invention is to limit the quantity of flip-flops needed for a plurality of switches.

It is another object of this invention to provide an improved coupling arrangement having a logical OR connection to one input terminal of a flip-flop and a logical AND connection to the other input terminal of the flip-flop.

A coupling arrangement in accordance with the invention provides a flip-flop having a set input and a reset input for coupling a plurality of mechanical or electromechanical switches to electronic circuitry. Each switch is operable in at least first and second positions to provide a closed circuit path when in each of the positions. The closed circuit paths of at least two of the switches when in the first position are coupled in series and to one of the set and reset inputs of the flip-flop to provide a first coupling arrangement. The closed circuit paths of the switches when in the second position are coupled in common to the other of the set and reset inputs of the flip-flops to provide a second coupling arrangement. Mechanical or electromechanical means are provided for placing the switches in either of the positions in response to logical information.

Figure 1:
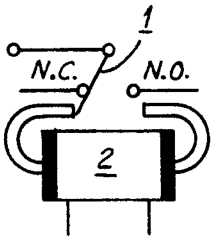
FIG. 1 is a schematic diagram of one of many well-known types of electromechanical switches.

In FIG. 1 a source of potential V is connected to a transfer contact 1. The transfer contact is moveable between a normally-closed contact NC and a normally-open contact NO by means of an electromagnetic arrangement shown generally at 2. The normally-open and normally-closed contacts can be connected to a load device (not shown in FIG. 1). Since the electromagnetic arrangement is well known and forms no part of this invention, no further description is necessary. However, the movement of the transfer contact may be controlled not only by electromagnetic means but also by mechanical means as well. For example, the transfer contact could be controlled by the movement of a cam. It is apparent to those skilled in the art that other mechanical or electromechanical means may be used to control the movement of the transfer contact.

Figure 2:
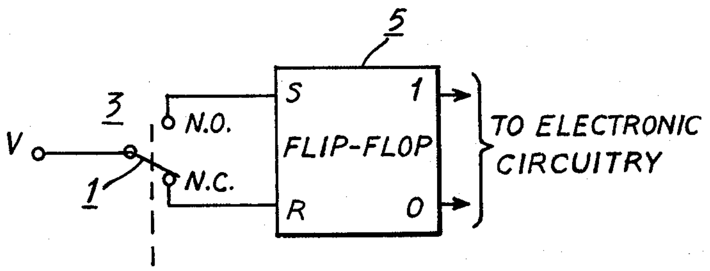
FIG. 2 is a circuit diagram of a coupling circuit.

In FIG. 2 a switch 3, which may be of the type described in FIG. 1, is shown with its normally-open and normally-closed contacts connected to the set and reset terminals respectively of a flip-flop 5. The flip-flop 5 may be any well known flip-flop. The mechanical or electromechanical means for controlling the movement of the transfer contact 1 is illustrated generally by the dotted line. The binary outputs "1" and "0" of flip-flop 5 are connected to electronic circuitry. As the transfer contact 1 is activated to the normally-open contact NO, the transfer contact bounces against the normally-open contact for a period of time. As soon as the potential source V supplies sufficient energy to the set terminal of the flip-flop through the bouncing transfer contact, the flip-flop becomes set and supplies a steady output to the electronic load device.

Figure 3:
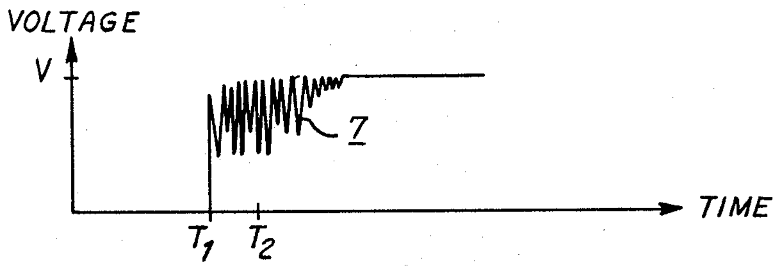
FIG. 3 is a voltage vs. time diagram illustrative of the contact bounce noise pulses.

In FIG. 3 a voltage vs. time diagram illustrative of the conditions at the normally-open contact is shown. If the transfer contact 1 is activated at time T1, the contact NO experiences a rapid rise in potential toward the voltage level V. At the same time, the contact NO also experiences a series of random noise pulses 7 due to the bounce of the transfer contact 1. At time T2, sufficient energy has been supplied to the flip-flop such that its threshold is exceeded whereby the outputs of the flip-flop are switched. The output signal of the flip-flop remains steady and undisturbed after time T2 even though the transfer contact 1 continues to bounce producing additional noise pulses as shown by that portion of the noise signals 7 occurring after time T2. Consequently, the flip-flop 5 is a coupling circuit which couples the switch terminals to electronic load devices without coupling the noise due to the action of the switch.

Figure 4:
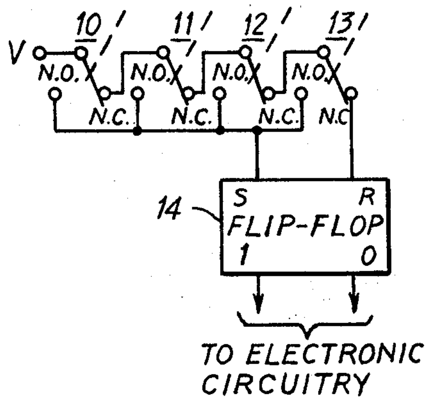
FIG. 4 is a schematic diagram of one embodiment of this invention.

In FIG. 4 switches 10, 11, 12 and 13 connect the potential source V to the reset terminal of a flip-flop 14 when all the respective transfer contacts are in the normally-closed position. The normally-open NO contacts of each of the switches 10, 11, 12 and 13 are connected in common to the set terminal of the flip-flop 14. The binary outputs of the flip-flop are connected to electronic circuitry. The means for controlling the movement of the transfer contacts of each of the switches is indicated by the dotted lines. Each of these means is responsive to logical input information to either move or not move the transfer contact of the associated switch. As connected the switches are capable of performing a logical OR function to the set side of the flip-flop, and of performing the logical AND to the reset side. Thus, if any one or more of the switches 10, 11, 12 or 13 is activated to its normally-open contact, the flip-flop 14 will become set. When all the switches are in their normally-closed NC position, the source V is connected to the reset terminal of the flip-flop. Consequently, there is provided a circuit wherein several mechanical or electromechanical switches share a single coupling flip-flop and wherein contact bounce noise is prevented from disturbing electronic load devices.

Figure 5:
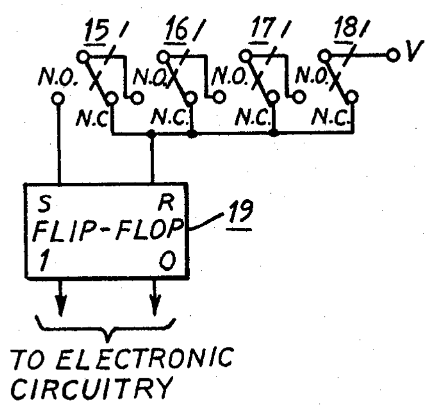
FIG. 5 is a schematic diagram of another embodiment of this invention.

In FIG. 5 switches 15, 16, 17 and 18 have their normally-closed contacts connected in common to the reset terminal of a flip-flop 19. The binary outputs of the flip-flop are connected to electronic circuitry. The normally-open contacts of the switches are connected in series to the set terminal of the flip-flop when all the switches are in their respective normally-open positions. The circuit as shown is capable of performing the logical AND function to the set side of the flip-flop and the logical OR to the reset side in response to logical input information transmitted to the transfer contacts of each of the switches by means of mechanical or electromechanical means illustrated by the dotted lines. Thus, flip-flop 19 becomes set if, and only if, all of the switches 15, 16, 17 and 18 are activated. If one or more of the switches is in its normally-closed position, the source V is connected to the reset input of the flip-flop.

Although the invention has been illustrated with a particular kind of switch, it is apparent to those skilled in the art that the principles involved are fully applicable to any type of switch which experiences contact bounce.

I claim:

1. The combination comprising:
- a source of potential,
- a plurality of switches each selectively operable in a first or second position,
- first and second output terminals,
- means for coupling said switches between the said source of potential and the said output terminals so that the source of potential is connected to said first output terminal when all of said switches are operated in said first position and to said second output terminal when any one of said switches is operated in said second position.

References Cited

UNITED STATES PATENTS

| | | | |
|---|---|---|---|
| 3,145,309 | 8/1964 | Bothwell | 307—88.5 |
| 3,324,306 | 6/1967 | Lockwood | 307—88.5 |
| 3,226,572 | 12/1965 | Kuroda | 307—88.5 |

OTHER REFERENCES

"Transistor: A New Class of Relays," by Brown & Beter Control Engineering, December 1956, pp. 71, 73 and 74.

ARTHUR GAUSS, *Primary Examiner.*

H. A. DIXON, *Assistant Examiner.*